United States Patent
Miyazawa (10) Patent No.: US 7,737,454 B2
(45) Date of Patent: Jun. 15, 2010

(54) ORGANIC LIGHT-EMITTING ELEMENT, ORGANIC LIGHT-EMITTING DEVICE, AND ELECTRONIC APPARATUS

(75) Inventor: Takashi Miyazawa, Hokuto (JP)

(73) Assignee: Seiko Epson Corporation, Tokyo (JP)

( * ) Notice: Subject to any disclaimer, the term of this patent is extended or adjusted under 35 U.S.C. 154(b) by 934 days.

(21) Appl. No.: 11/356,365

(22) Filed: Feb. 17, 2006

(65) Prior Publication Data

US 2006/0192210 A1    Aug. 31, 2006

(30) Foreign Application Priority Data

Feb. 25, 2005    (JP) ............... 2005-051979

(51) Int. Cl.
*H01L 29/22* (2006.01)
*H01L 29/24* (2006.01)

(52) U.S. Cl. ......................... 257/98; 257/103
(58) Field of Classification Search ............ 257/79, 257/86, 87, 98, 101–103, E33.013
See application file for complete search history.

(56) References Cited

U.S. PATENT DOCUMENTS

2004/0086745 A1    5/2004    Iwakuma et al.

2007/0007538 A1    1/2007    Ono et al.

FOREIGN PATENT DOCUMENTS

| EP | 1 583 166 A2 | 3/2005 |
|---|---|---|
| JP | A 10-12377 | 1/1998 |
| JP | A 10-153967 | 6/1998 |
| JP | A 11-40358 | 2/1999 |
| JP | A 2000-026851 | 1/2000 |
| JP | 2002-270369 * | 9/2002 |
| JP | A 2004-273137 | 9/2004 |
| JP | A 2004-307808 | 11/2004 |
| WO | WO 2004/058912 A2 | 7/2004 |
| WO | WO 2004/112440 A1 | 12/2004 |

OTHER PUBLICATIONS

Tang et al.; Organic electroluminescent diodes; Appl. Phys. Lett. 51 (12); Sep. 21, 1987; pp. 913-915.
Carter et al.; Operating stability of light-emiting polymer diodes based on poly(p-phenylene vinylene); Appl. Phys. Lett. 71 (1), Jul. 7, 1997; pp. 34-36.
Gustafsson et al.; Flexible light-emitting diodes made from soluble conducting polymers; Letters to Nature, vol. 357, Jun. 11, 1992; pp. 477-479.

\* cited by examiner

*Primary Examiner*—Hung Vu
(74) *Attorney, Agent, or Firm*—Oliff & Berridge, PLC (57) ABSTRACT

A light-emitting element includes a first electrode, a second electrode, and a light-emitting layer disposed between the first electrode and the second electrode, the light-emitting layer including an inorganic semiconductor material, a first material, and a second material, at least one of the first material and the inorganic semiconductor material having a function emit light.

20 Claims, 4 Drawing Sheets

ORGANIC LIGHT-EMITTING ELEMENT, ORGANIC LIGHT-EMITTING DEVICE, AND ELECTRONIC APPARATUS

BACKGROUND

1. Technical Field

The present invention relates to a light-emitting element, a light-emitting device, and an electronic apparatus.

2. Related Art

An element displaying various luminescent colors can be made by a light-emitting element including at least one light-emitting layer. For example, such light-emitting element is disclosed in the following examples of related art: Appl. Phys. Lett. 51(12), 21 Sep. 1987, p. 913; Appl. Phys. Lett. 71(1), 7 Jul. 1997, p. 34; Nature 357, 477 1992; JP-A-10-153967; JP-A-10-12377; and JP-A-11-40358.

Currently, researches, which include proposals of various device structures as well as developments and improvements of materials, are actively carried out in order to achieve a light-emitting element having higher performances.

In addition, an element having various luminescent colors, or an element having high luminance and high efficiency has already been developed as the light-emitting element. The light-emitting element is examined for various practical uses such as a use of pixels in display devices, or a light source.

Various researches are carried out to further improve a light emitting efficiency for its practical use.

SUMMARY

An advantage of the invention is to provide a light-emitting element having an excellent light emitting efficiency, and a light-emitting device and an electronic apparatus that have high reliability with the light-emitting element.

The advantage will be achieved as described below.

A light-emitting element of a first aspect of the invention includes a first electrode, a second electrode, and a light-emitting layer disposed between the first electrode and the second electrode, the light-emitting layer including an inorganic semiconductor material, a first material, and a second material, at least one of the first material and the inorganic semiconductor material having a function to emit light.

Accordingly, a light-emitting element excellent in a light emitting efficiency can be achieved.

In the light-emitting element of the first aspect of the invention, it is preferable that the second material has a function to transport a carrier contributing a light emitting of at least one of the inorganic semiconductor material and the first material.

Accordingly, the light emitting efficiency of the light-emitting element is further improved.

In the light-emitting element of the first aspect of the invention, it is preferable that the first material has the function to emit light, the inorganic semiconductor material has a function to transport the first carrier, and the second material has a function to transport the second carrier.

Accordingly, the light emitting efficiency of the light-emitting element is further improved.

In the light-emitting element of the first aspect of the invention, it is preferable that the first carrier is an electron, and the second carrier is a hole.

The light-emitting element of the first aspect of the invention is preferable for the structure described above.

In the light-emitting element of the first aspect of the invention, it is preferable that the inorganic semiconductor material is a metal oxide.

Because, the metal oxide is excellent in electron transport ability.

In the light-emitting element of the first aspect of the invention, it is preferable that the metal oxide contains a trivalent element and a pentavalent element.

The metal oxide described above is particularly excellent in electron transport ability.

In the light-emitting element of the first aspect of the invention, it is preferable that the second material contains at least one acid group as a linking group that can bond to the inorganic semiconductor material.

The reason why the acid group is preferable is that it has high ability of bonding to the inorganic semiconductor material (particularly, to the metal oxide).

In the light-emitting element of the first aspect of the invention, it is preferable that the acid group is —$SO_3$ group, —COOH group, or —$OP(O)(OH)_2$ group.

These acid groups are preferable because they are particularly excellent in combining ability.

In the light-emitting element of the first aspect of the invention, it is preferable that the first material is a metallic complex.

The metallic complex is preferable because it can relatively easily be adsorbed to the inorganic semiconductor material, and has a high inner quantum yield of light emitting as shown in its phosphorescent emission.

In the light-emitting element of the first aspect of the invention, it is preferable that the light-emitting layer contains a plurality of particles, each of which contains the inorganic semiconductor material.

Accordingly, the area of the contact between the first material and the inorganic semiconductor material or between the first material and the inorganic semiconductor material increases, thereby enabling the probability of re-bonding the hole and electron to be increased. As a result, the light emitting efficiency of the light-emitting element is improved.

In the light-emitting element of the first aspect of the invention, it is preferable that the average particle diameter of the plurality of particles is 0.5 to 10 nm.

Accordingly, the quantity of the first material adsorbed to the inorganic semiconductor material can be increased.

In the light-emitting element of the first aspect of the invention, it is preferable that the second material is adsorbed to the surface of each of the plurality of particles and/or resides in the gaps between the plurality of particles.

Accordingly, the first material and the second material can be reliably contacted.

In the light-emitting element of the first aspect of the invention, it is preferable that the second material contains at least one linking group that can bond to the inorganic semiconductor material.

Accordingly, the second material is reliably adsorbed (bonded) to the organic semiconductor material, enabling the second material and the first material to be more reliably contacted via the inorganic semiconductor material.

In the light-emitting element of the first aspect of the invention, it is preferable that the ratio of the inorganic semiconductor material to the second material is 20:80 to 80:20 by weight in the light-emitting layer.

Accordingly, the light emitting efficiency of the light-emitting element can be further improved.

In the light-emitting element of the first aspect of the invention, it is preferable that the ratio of the inorganic semiconductor material to the first material is 95:5 to 75:25 by weight in the light-emitting layer.

Accordingly, the light emitting efficiency of the light-emitting element can be further improved.

In the light-emitting element of the first aspect of the invention, it is preferable that the average thickness of the light-emitting layer is 1 to 100 nm.

The light-emitting element can be made thin while preventing the mechanical strength (film strength) of the light-emitting layer from being lowered.

In the light-emitting element of the first aspect of the invention, it is preferable that an intermediate layer mainly made of a semiconductor material and/or an insulation material is provided at least one of between the light-emitting layer and the first electrode, and between the light-emitting layer and the second electrode.

Accordingly, lowering a characteristic such as the light emitting efficiency, i.e. lowering the service life (durability) of the light-emitting element due to the increase in a leakage current with time can be prevented.

In the light-emitting element of the first aspect of the invention, it is preferable that the average thickness of the intermediate layer is 10 nm or less.

Accordingly, the inorganic semiconductor material or the carrier transport material in the light-emitting layer can reliably be prevented from being contacted to the electrode while preventing the efficiency of injecting the carrier from the electrode to the light-emitting layer from being lowered.

A light-emitting device of a second aspect of the invention includes the light-emitting element of the first aspect of the invention.

Accordingly, a light-emitting device having high reliability can be achieved.

An electronic apparatus of a third aspect of the invention includes the light-emitting device of the second aspect of the invention.

Accordingly, an electronic apparatus with high reliability can be achieved.

BRIEF DESCRIPTION OF THE DRAWINGS

The invention will be described with reference to the accompanying drawings, wherein like numbers refer to like elements, and wherein.

DESCRIPTION OF EXEMPLARY EMBODIMENTS

Hereinafter, preferred embodiments of the light-emitting element, light-emitting device, and electronic apparatus of the invention will be described with reference to drawings.

Figure 1:
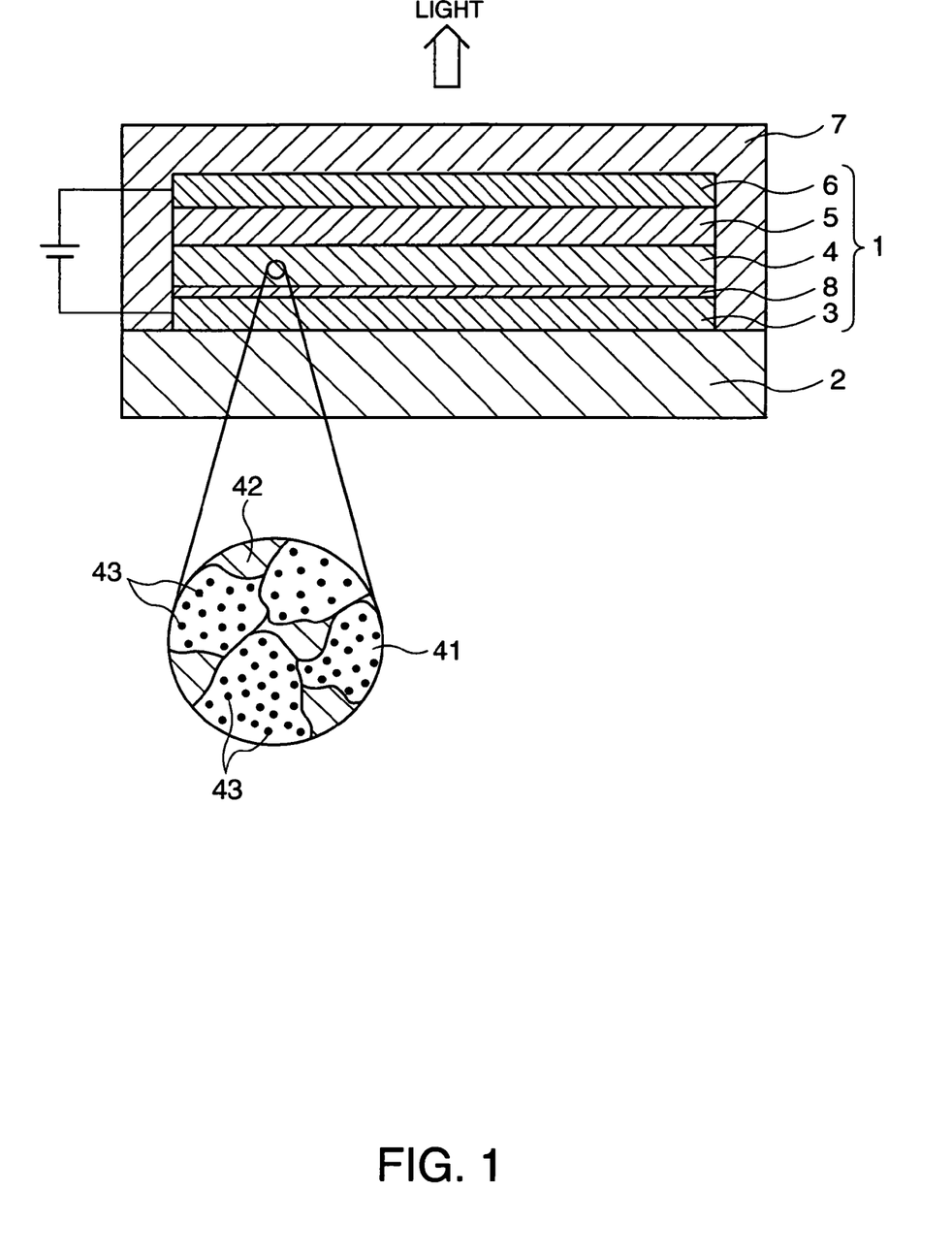
FIG. 1 is a longitudinal cross-sectional view schematically illustrating an embodiment of the light-emitting element of the invention.

FIG. 1 is a longitudinal cross-sectional view schematically illustrating an embodiment of the light-emitting element of the invention. In the following description, the upper side in FIG. 1 is described as up, while the lower side in FIG. 1 is described as down for simplifying the description.

A light-emitting element (electroluminescent element) 1 shown in FIG. 1 includes a cathode (a first electrode) 3, an anode (a second electrode), a light-emitting layer 4 and a hole transport layer 5, which layers are interposed between the cathode 3 and the anode 6, and an intermediate layer 8 provided between the light-emitting layer 4 and the cathode 3. The light-emitting element 1 is wholly disposed on a substrate 2, and is sealed with a sealing member 7.

The substrate 2 serves as a support for the light-emitting element 1. Since the light-emitting element 1 of the embodiment has a structure (top-emission type) in which light is extracted from a side opposite to the substrate 2, transparency is not particularly required for the substrate 2 and the cathode 3.

As the substrate 2, for example, a transparent substrate and an opaque substrate can be used. The transparent substrate is made of a resin material such as polyethylene terephthalate, polyethylene naphthalate, polypropylene, cycloolefin polymer, polyamide, polyether sulfone, polymethyl methacrylate, polycarbonate, or polyarylate, a glass material such as silica glass or sode glass. The opaque substrate includes a substrate made of a ceramic material such as almina, one such as a metal substrate such as a stainless steel on the surface of which an oxide film (insulation film) is formed, and a substrate made of an opaque resin material.

The average thickness of the substrate 2 described as above is not limited to any specific value, but is preferably about 0.1 to 30 mm, more preferably about 0.1 to 10 mm.

Here, when the light-emitting element 1 has a structure (bottom-emission type) in which light is extracted from a side of the substrate 2, the substrate 2 and the cathode 3 are made substantially transparent (colorless and transparent, colored and transparent, or translucent).

The cathode 3 is an electrode that injects electrons into the light-emitting layer 4 described later. A material having a small work function is preferably used as the material for the cathode 3.

Examples of the material for the cathode 3 include Li, Mg, Ca, Sr, La, Ce, Er, Eu, Sc, Y, Yb, Ag, Cu, Al, Cs, Rb, and alloys containing them. Theses materials can be used singly or in combination of two or more of them (e.g. a multilayered body composed of multiple layers).

Particularly, in a case where an alloy is used as the material for the cathode 3, an alloy containing a stable metallic element such as Ag, Al, Cu, specifically an alloy such as MgAg, AlLi, and CuLi, is preferably used. The use of such alloy as the material for the cathode 3 makes it possible to improve an electron injection efficiency and stability of the cathode 3.

The average thickness of the cathode 3 described as above is not limited to any specific value, but is preferably about 100 to 10000 nm, more preferably about 200 to 500 nm.

In addition, the surface resistance of the cathode 3 is preferably as lower as possible. Specifically, it is preferably 50 Ω/square or less, more preferably is 20 Ω/square or less. The lower limit of the surface resistance is not limited to any specific value, but is, preferably typically, about 0.1 Ω/square.

In contrast, the anode 6 is an electrode that injects holes into the hole transport layer 5 described later. A material having a large work function and excellent conductivity is preferably used as the material for the anode 6.

Examples of the material for the anode 6 include: oxides such as indium tin oxide (ITO), indium zinc oxide (IZO), $In_3O_3$, $SnO_2$, $SnO_2$ containing Sb, and ZnO containing Al; and Au, Pt, Ag, Cu, and alloys containing them. These materials can be used singly or in combination of two or more of them.

The average thickness of the anode 6 is not limited to any specific value, but is preferably about 10 to 200 nm, more preferably about 50 to 150 nm.

In addition, the surface resistance of the anode 6 is also preferably as lower as possible. Specifically, it is preferably 100 Ω/square or less, more preferably is 50 Ω/square or less. The lower limit of the surface resistance is not limited to any specific value, but is, preferably typically, about 0.1 Ω/square.

The hole transport layer 5 has the function transporting holes, which are injected from the anode 6, to the light-emitting layer 4. It also has the function preventing an inorganic semiconductor particle (granular inorganic semiconductor material) 41 contained in the light-emitting layer 4 described later from being contacted to the anode 6, namely has the same function as that of the intermediate layer 8 described later.

Various kinds of high-molecular weight material and low-molecular weight material can be used singly or in combination of them as the material for the hole transport layer 5.

Examples of a p-type high-molecular weight material (organic polymer) can include polyarylamine, fluorene-arylamine copolymer, fluorene-bithiophene copolymer, poly(N-vinylcarbazole), polyvinylpyrene, polyvinylanthracene, poly thiophene, polyhexylthiophene, polyhexylthiophene, poly(p-phenylenevinylene), polythienylenevinylene, pyrene formaldehyde resin, and ethylcarbazole formaldehyde resin and its derivative.

Compounds described above also can be used as a mixture with other compounds. As an example of the mixture containing polythiophene, poly(3,4-ethylene dioxythiophene/styrenesulfonic acid) (PEDOT/PSS) can be cited.

In contrast, examples of a p-type low-molecular weight material can include: arylcycloalkane-based compounds such as 1,1-bis(4-di-para-triaminophenyl)-cyclohexane and 1,1'-bis(4-di-para-tolylaminophenyl)-4-phenyl-cyclohexane; arylamine-based compounds such as 4,4',4"-trimethyltriphenylamine, N,N,N',N'-tetraphenyl-1,1'-biphenyl-4,4'-diamine, N,N'-diphenyl-N,N'-bis(3-methylphenyl)-1,1'-biphenyl-4,4'-diamine (TPD1), N,N'-diphenyl-N,N'-bis(4-methoxyphenyl)-1,1'-biphenyl-4,4'-diamine (TPD2), N,N,N',N'-tetrakis(4-methoxyphenyl)-1,1'-biphenyl-4,4'-diamine (TPD3), N,N'-di(1-naphthyl)-N,N'-dip-henyl-1,1'-biphenyl-4,4'-diamine (α-NPD); phenylenediamine-based compounds such as N,N,N',N'-tetraphenyl-para-phenylenediamine, N,N,N',N'-tetra(para-tolyl)-para-phenylenediamine, and N,N,N',N'-tetra(meta-tolyl)-meta-phenylenediamine (PDA); carbazole-based compounds such as carbazole, N-isopropylcarbazole, and N-phenylcarbazole; stilbene-based compounds such as stilbene, and 4-di-para-tolylaminostilbene; oxazole-based compounds; triphenylmethane-based compounds such as triphenylmethane; pyrazoline-based compounds such as 1-phenyl-3-(para-dimethylaminophenyl)pyrazoline; benzine (cyclohexadiene)-based compounds; triazole-based compounds such as triazole; oxadiazole-based compounds such as oxadiazole, 1,3,4-oxadiazole, and 2,5-di(4-dimethylaminophenyl)-1-,3,4-oxadiazole; anthracene-based compounds such as anthracene, and 9-(4-diethylaminostyryl)anthracene; fluorenone-based compounds such as fluorenone, 2,4,7-trinitro-9-fluorenone, and 2,7-bis(2-hydroxy-3-(2-chlorophenylcarbamoyl)-1-naphthylazo)fluorenone; aniline-based compounds such as polyaniline; silane-based compounds; pyrrole-based compounds such as poly(2,2'-thienylpyrrole), and 1,4-dithioketo-3,6-diphenyl-pyrrolo-(3,-4-c)pyrrolopyrrole; florene-based compounds such as florene; porphyrin-based compounds such as porphyrin, and metal tetraphenylporphyrin; quinacridon-based compounds such as quinacridon; metallic or non-metallic phthalocyanine-based compounds such as phthalocyanine, copper phthalocyanine, tetra(t-butyl)copper phthalocyanine, and iron phthalocyanine; metallic or non-metallic naphthalocyanine-based compounds such as copper naphthalocyanine, vanadyl naphthalocyanine, and monochloro gallium naphthalocyanine; and benzidine-based compounds such as N,N'-di(naphthalene-1-yl)-N,N'-diphenyl-benzidine and N,N,N',N'-tetraphenylbenzidine. These compounds can be used singly or in combination of two or more.

A high-molecular weight material mainly containing polyarylamine or its derivative is preferably used as the material for the hole transport layer 5.

Here, triphenylamine-based high-molecular weight material expressed by chemical formula 1 can be exemplified as an example of the polyarylamine derivative.

Chemical Formula 1

The average thickness of the hole transport layer 5 described as above is not limited to any specific value, but is preferably about 10 to 150 nm, more preferably about 50 to 100 nm.

The light-emitting layer 4 is provided so as to be contacted to the hole transport layer 5.

The light-emitting layer 4 of the embodiment includes the inorganic semiconductor particle 41 (hereinafter, simply referred to as the particle 41) transporting electrons (a first carrier), a hole transport material (carrier transport material) 42 transporting holes (a second carrier having a different polarity from that of the first carrier), and a light emitting material (light emitting substance) 43 as shown in FIG. 1 as being expanded.

Specifically, in the light-emitting layer 4, the light emitting material (a first material) 43 is bonded (adsorbed) to the surface of the particle 41, and the gap between the particles 41 is filled with the hole transport material (a second material) 42.

In the light-emitting layer 4 as structured above, electrons injected from the cathode 3 are transported via the particle 41, while holes received from the hole transport layer 5 are transported via the hole transport material 42. Then, holes and electrons are re-bonded in the light emitting material 43 to produce excitons (exciters). The excitons release (emit light) energy (fluorescence or phosphorescence) when returning to the ground state.

In the light-emitting layer 4, the light emitting material 43 and the hole transport material 42 can more reliably be contacted via the particle 41. As a result, the light emitting efficiency of the light-emitting element 1 can be further improved.

In addition, inorganic materials excellent in chemical stability are known as the semiconductor material. The use of the semiconductor material excellent in chemical stability allows the durability of the light-emitting element 1 to be further improved.

Moreover, if an air gap is formed between the particles 41 or the surface of the particle 41, the area of the contact between the light emitting material 43 and the surface of the particle 41 or between the hole transport material 42 and the surface of the particle 41 increases, enabling the probability of re-bonding the hole and electron to be increased. As a result, the light emitting efficiency of the light-emitting element 1 can be improved.

This resulting in a light emitting site being expanded, reducing a carrier density in the light emitting material 43. As a result, the speed (level) of changing or deteriorating properties of each light emitting material can be reduced. Namely, the durability (service life) of the light-emitting element 1 can be improved.

Examples of the inorganic semiconductor material for the particle 41 include various metal oxides such as titanium oxide, and zinc oxide, various metal sulfides (ZnS, and CdS), various metal selenides (CdSe and the like), various metals or semiconductor carbides (TiC, and SiC), various semiconductor nitrides (BN and the like), GaN, and AlN. These materials can be used singly or in combination of two or more of them.

Among them, one mainly containing the metal oxide is preferable for the inorganic semiconductor material. Because, the metal oxide is excellent in electron transport ability.

As for the metal oxide, a metal oxide containing one metallic element such as titanium oxide ($TiO_2$), zirconium oxide ($ZrO_2$), zinc oxide (ZnO), aluminum oxide ($Al_2O_3$), or tin oxide ($SnO_2$), or a compound oxide containing more than one metallic element, may be employed, but the compound oxide, particularly the compound oxide mainly containing a trivalent element and a pentavelent element, is preferable. These metal oxides are particularly excellent in electron transport ability.

Here, the compound oxide containing the trivalent and pentavalent elements is defined as a solid solution oxide containing both the trivalent and pentavalent elements in one crystal, and can be expressed by the following general formula 1. The mixing ratio of the trivalent element to the pentavalent element can take any values.

General Formula 1 where, $M_A$ is the trivalent element, $M_B$ is the pentavalent element, and O is oxygen. each of x and y is a number from zero to one.

Each of the trivalent element expressed by $M_A$ and the pentavalent element expressed by $M_B$ may be single element or a mixture of one or more elements.

Examples of the trivalent element include: elements in the third-group of the periodic system—scandium, yttrium, lanthanum, and lanthanoid; and elements in the $13^{th}$-group of the periodic system—boron, aluminum, gallium, indium, and thallium. The element in the third-group, particularly scandium, is preferable.

In contrast, examples of the pentavalent element include: elements in the fifth-group of the periodic systems—vanadium, niobium, and tantalum; and elements in the $15^{th}$-group of the periodic systems—nitrogen, phosphorus, arsenic, antimony, and bismuth. The element in the fifth-group, particularly vanadium, is preferable.

In addition, each of x and y is preferably from 0.2 to 0.8, more preferably from 0.4 to 0.6, and further preferably from 0.48 to 0.52.

The compound oxide expressed by the general formula 1 may contain an impurity element.

Examples of the compound oxide include $ScVO_4$, $YVO_4$, $LaVO_4$, $NdVO_4$, $EuVO_4$, $GdVO_4$, $ScNbO_4$, $ScTaO_4$, $YNbO_4$, $YTaO_4$, $ScPO_4$, $ScAsO_4$, $ScSbO_4$, $ScBiO_4$, $YPO_4$, $YSbO_4$, $BVO_4$, $AlVO_4$, $GaVO_4$, $InVO_4$, $TlVO_4$, $InNbO_4$, $InTaO_4$ and the like.

The average particle diameter of the particle 41 is preferably about 0.5 to 10 nm, more preferably about 1 to 7 nm. Accordingly, the above-described effect can be further improved. The particle 41 may be a secondary particle containing such fine particle as a primary particle.

Here, a method for synthesizing the compound oxide containing the trivalent and pentavalent elements will be described.

Examples of the method for synthesizing the compound oxide containing the trivalent and pentavalent elements include a firing method, sol-gel process, and the like.

The firing method is the method in which an oxide of the trivalent element and an oxide of the pentavalent element are mixed, followed by thoroughly crushed or mixed in a mortar or the like, and then fired by using an electric furnace or the like. The firing temperature is usually about 400 to 2000 degrees centigrade.

The firing and crushing may repeat two and above times. This enables the compound oxide to be more uniformed.

In contrast, the sol-gel process is the method in which a solution of an inorganic or organic compound containing the trivalent element, and a solution of an inorganic or organic compound containing the pentavalent element are mixed so that hydrolysis and condensation proceed, thereby achieving the compound oxide as a fine particle dispersion.

As a solvent, one containing at least water, for example, water or alcohol—methanol, ethanol, propanol, butanol, or the like, containing water is preferably used.

In a case where the two solutions are mixed, they are thoroughly agitated though they may be mixed at once or by using a method of dropping them simultaneously. At least until when the total volume of the two solutions are mixed up, they are preferably agitated at a room temperature.

After mixing the two solutions, the mixed solution is preferably heated. This heating allows the crystallization of the compound oxide or the growth of the particle to be enhanced.

In the heating, a pressure vessel is preferably used. Examples of the pressure vessel include an autoclave made of stainless steel, an autoclave made of titanium, an autoclave made of stainless steel inner circumferential surface of which is made of titanium or polytetrafluoroethylene, and the like.

It is preferable that the autoclave is equipped with a stirrer. When using the autoclave, it is preferable that the heating temperature is typically about 100 to 300 degrees centigrade, and the heating time is typically about 1 to 50 hours.

Examples of the inorganic or organic compound containing the trivalent or pentavalent element include alkoxide, acetylacetonato, nitrate salt, acetate salt, oxalate, chloride salt, oxychloride, and bromode that contain one of the two elements.

Examples of the compound containing the trivalent element include scandium nitrate hydrate, gallium nitrate hydrate, indium nitrate hydrate, yttrium nitrate hydrate, scandium chloride, gallium chloride, indium chloride, yttrium chloride, scandium isopropoxide, aluminum nitrate, neodymium nitrate, indium ethoxide, yttrium isopropoxide, and the like.

Examples of the compound containing the pentavalent element include sodium orthovanadate, ethyl orthoniobate, niobium chloride, tantalum chloride, ammonium arsenate, sodium antimonate, sodium bismuthate, and the like.

In the sol-gel reaction, a catalyst is preferably used if necessary. An inorganic or organic acid is preferably used for the catalyst.

Examples of the inorganic acid include hydrochloric acid, hydrogen bromide, hydrogen iodide, sulfuric acid, sulfurous acid, nitric acid, nitrous acid, phosphoric acid, phosphorous acid, and the like.

Examples of the organic acid include carboxylic acid, sulfonic acid, phosphoric, phosphonic acid, Lewis acid (aluminate acid and the like), heteropoly acid, and the like.

As the catalyst, for example, alkalies such as ammono also can be used in addition to the above-described acids.

As a result, the compound oxide is achieved.

An impurity (dopant) may be added into the compound oxide, if necessary.

Examples of the impurity element include: elements in the fourth-group of the periodic system such as titanium, zirconium, and hafnium; elements in the $14^{th}$-group of the periodic system such as germanium, tin, and lead; sulfur; selenium; tellurium; and halogen elements such as fluorine, chlorine, bromine, and iodine.

In order to dope the impurity (impurity element), the oxide containing the impurity to be doped is mixed into a raw material for the synthesis if the compound oxide is synthesized by the firing method. In contrast, if the compound oxide is synthesized by the sol-gel process, the impurity element to be doped or the oxide containing the impurity element is added into the sol-gel solution.

In this case, the impurity quantity added into the compound oxide is preferably about 0.01 mol % to 10 mol % to the total quantity of the trivalent element, more preferably about 0.1 mol % to 1 mol %.

The same material as that exemplified for the hole transport layer 5 can be used for the hole transport material 42. Particularly, one having at least one linking group that can be bonded to the particle (inorganic semiconductor material) 41 is preferable. This allows the hole transport material 42 to be reliably adsorbed (bonded) to the particle 41, resulting in the hole transport material 42 and the light emitting material 43 being more reliably contacted via the particle 41.

Examples of the linking group include: acid group such as —SO$_3$H group, —SO$_2$H group, —COOH group, —OP(O)(OH)$_2$ group, and —P(O)(OH)$_2$ group; and chelating group such as oxime, dioxime, hydroxyquinoline, salicylate, and α-keto-enolate.

Among them, the acid group is preferable for the linking group, and —SO$_3$H group, —COOH group or —OP(O)(OH)$_2$ group is more preferable. Because the acid group has high capability to bond to the inorganic semiconductor material (particularly, metal oxide), and —SO$_3$H group, —COOH group or —OP(O)(OH)$_2$ group is excellent in particularly the capability.

The linking group may form a salt with an alkali metal or the like, or may form an inner salt.

In consideration of the matters described above, poly(3,4-ethylenedioxythiophene/styrenesulfonic acid) (PEDOT/PSS) is preferably used for the hole transport material 42 among them described above.

In the light-emitting layer 4, the weight ratio of the particle (inorganic semiconductor material) 41 to the hole transport material (carrier transport material) 42 is preferably about 20:80 to 80:20, more preferably 40:60 to 60:40. As a result, electrons and holes are efficiently supplied to the light emitting material 43, enabling the light emitting efficiency of the light-emitting element 1 to be further improved.

As for the light emitting material 43, various kinds of high-molecule and low-molecule light emitting materials can be used singly or in combination of any two or more of them.

Examples of a high-molecular weight light emitting material include polyacetylene-based compounds such as trans-type polyacetylene, cis-type polyacetylene, poly(di-phenylacetylene) (PDPA), and poly(alkyl, phenylacetylene) (PAPA); polyparaphenylenevinylene-based compounds such as poly(para-phenylenevinylene) (PPV), poly(2,5-dialkoxy-para -phenylenevinylene) (RO-PPV), cyano-substituted-poly (para -phenylenevinylene) (CN-PPV), poly(2-dimethyloctyl-silyl-para -phenylenevinylene) (DMOS-PPV), and poly(2-methoxy-5-(2'-ethylhexoxy)-para-phenylenevinylene) (MEH-PPV); polythiophene-based compounds such as poly (3-alkylthiophene) (PAT), and poly(oxypropylene)triol (POPT); polyfluorene-based compounds such as poly(9,9-dialkylfluorene) (PDAF); polyfluorene-based compounds such as poly(9,9-dioctylfluorene-co-2,1,3-benzothiadiazole) (PD8BT), α,ω-bis[N,N'-di(methylphenyl)aminophenyl]-poly[9,9-bis(2-ethylhexyl)fluoren-2,7-diyl] (PF2/6am4), and poly(9,9-dioctyl-2,7-divinylenefluorenylene-alt-co(an-thracene-9,10-diyl); polyparaphenylene -based compounds such as poly(para-phenylene) (PPP), and poly(1,5-dialkoxy-para-phenylene) (RO-PPP); polycarbazole-based compounds such as poly(N-vinylcarbazole) (PVK); and polysilane-based compounds such as poly(methylphenylsilane) (PMPS), poly(naphthylphenylsilane) (PNPS), and poly(biphenylylphenylsilane) (PBPS).

Examples of such a low-molecular weight light emitting material can include: tricoordinated iridium complex having a ligand of 2,2'-bipyridine-4,4'-dicarboxylic acid expressed by the following chemical formula 2; various metallic complexes such as fac-tris(2-phenylpyridine)iridium (Ir(ppy)$_3$), 8-hydroxyquinoline aluminum (Alq3), tris(4-methyl-8-quinolinolate) aluminum(III) (Almq3), 8-hydroxyquinoline zinc (Znq2), (1,10-phenanthroline)-tris-(4,4,4-trifluoro-1-(2-thienyl)-butane-1,3-dionate) europium(III) (Eu(TTA)$_3$(phen)), and 2,3,7,8,12,13,17,18-octaethyl-21H,23H-porphin platinum(II); benzene-based compounds such as distyrylbenzene (DSB), and diaminodistyrylbenzene (DADSB); naphthalene-based compounds such as naphthalene and Nile red; phenanthrene-based compounds such as phenanthrene; chrysene-based compounds such as chrysene and 6-nitrochrysene; perylene-based compounds such as perylene, and N,N'-bis(2,5-di-t-butylphenyl)-3,4,9,10-perylene-di-carboxy imide (BPPC); coronene-based compounds such as coronene; anthracene-based compounds such as anthracene, and bisstyrylanthracene; pyrene-based compounds such as pyrene; pyran-based compounds such as 4-(di -cyanomethylene)-2-methyl-6-(para-dimethylami-nostyryl)-4H-pyran (DCM); acridine-based compounds such as acridine; stilbene-based compounds such as stilbene; thiophene-based compounds such as 2,5-dibenzooxazo-lethiophene; benzooxazole-based compounds such as benzooxazole; benzoimidazole-based compounds such as benzoimidazole; benzothiazole-based compounds such as 2,2'-(para-phenylenedivinylene) -bisbenzothiazole; butadiene-based compounds such as bistyryl(1,4-diphenyl-1,3-butadiene), and tetraphenylbutadiene; naphthalimide -based compounds such as naphthalimide; coumarin-based compounds such as coumarin; perynone-based compounds such as perynone; oxadiazole-based compounds such as oxadiazole; aldazine-based compounds; cyclopentadiene-based compounds such as 1,2,3,4,5-pentaphenyl-1,3-cyclopentadiene (PPCP); quinacridone-based compounds such as quinacridone and quinacridone red; pyridine-based compounds such as pyrrolopyridine, and thiadiazolopyridine; spiro compounds such as 2,2',7,7'-tetraphenyl-9,9'-spirobifluorene; metallic or non-metallic phthalocyanine-based compounds such as phthalocyanine ($H_2Pc$), and copper phthalocyanine; florene-based compounds such as florene.

Chemical Formula 2

Among them, one mainly containing the metallic complex is preferably used for the light emitting material 43. The metallic complex containing a transition metal such as iridium is preferable because it can relatively easily be adsorbed to the particle (inorganic semiconductor material) 41, and has a high inner quantum yield of light emitting as shown in its phosphorescent emission.

In the light-emitting layer 4, the weight ratio of the particle (inorganic semiconductor material) 41 to the light emitting material 43 is preferably about 95:5 to 75:25, more preferably about 90:10 to 80:20. The light-emitting layer 4 containing the light emitting material having the above-described quantity allows the light emitting efficiency of the light-emitting element 1 to be further improved.

The average thickness of the light-emitting layer 4 is not limited to any specific value, but is preferably about 1 to 100 nm, more preferably about 20 to 50 nm. As a result, the light-emitting element 1 can be made thin while preventing the mechanical strength (film strength) of the light-emitting layer 4 from being lowered.

The sealing member 7, which is provided so as to cover the cathode 3, the light-emitting layer 4, the hole transport layer 5 and the anode 6, has a function to shut out oxygen or water by sealing them airtight. By providing the sealing member 7, effects can be achieved in which of the reliability of the light-emitting element 1 is improved, or changing or deteriorating the properties thereof is prevented (improvement of durability).

Examples of the sealing member 7 include: Al, Au, Cr, Nb, Ta, and Ti; alloys containing them; silicon oxide; various resin materials; and the like. In this regard, in a case where a material having conductivity is used as a constituent material of the sealing member 7, an insulation film is preferably provided between the sealing member 7 and each of the cathode 3, the light-emitting layer 4, the hole transport layer 5, and the anode 6 in order to prevent a short therebetween, if necessary.

The sealing member 7 may be prepared in a flat plate shape so as to face the substrate 2. Then, for example, a sealing material such as thermosetting resin may seal therebetween.

In the light-emitting element 1 structured as above, the intermediate layer (underlayer) 8 mainly made of the semiconductor material and/or insulation material is disposed between the light-emitting layer 4 and the cathode 3.

The intermediate layer 8 may be given a function to prevent holes injected from the anode 6 from being reached to the cathode 3, or also can be given a function to slow down the mobility of electrons injected from the cathode 3 to the light-emitting layer 4.

As for the material for the intermediate layer 8, any material is arbitrary chosen depending on the other layers such as the hole transport layer or light-emitting layer, the kind of electrode or the like, property such as a desired luminescent color, or the like. While it is not limited to any specific material, typically, a material having a high resistance value such as the semiconductor material, or insulation material is preferable. For example, one may be used that is the same as the inorganic semiconductor material described above.

In contrast, examples of the insulation material for the intermediate layer 8 include: an inorganic insulation material such as $SiO_2$; an organic insulation material such as polyethylene resin, and polystyrene; and the like. These materials can be used singly or in combination of two or more of them.

The average thickness of the intermediate layer 8 is arbitrary chosen depending on the other layers such as the hole transport layer or light-emitting layer, the kind of electrode or the like, or property such as a desired luminescent color or the like. Typically, it is preferably 10 nm or less, more preferably about 1 to 7 nm.

The light-emitting element 1 can be manufactured as follows, for example.

[1] First, the substrate 2 is prepared. Then, the cathode 3 is formed on the substrate 2.

The cathode 3 can be formed by the following methods, for example: a chemical vapor deposition (CVD) method such as a plasma CVD, a thermal CVD, and a laser CVD; a dry plating method such as a vacuum deposition, sputtering, and ion plating; a vapor film forming method such as thermal spraying; a wet plating method such as an electrolytic plating, and immersion plating, electroless plating; a liquid phase film forming method such as a sol-gel processing, and a MOD method; joining of metal foil; and the like.

[2] Next, the intermediate layer 8 is formed on the cathode 3.

The intermediate layer 8 can be formed, for example, by using the vapor film forming method or the liquid phase film forming method, which are described above.

Among them, the intermediate layer 8 is preferably formed by using the vapor film forming method. The vapor film forming method allows the intermediate layer 8 to be more densely formed. As a result, the effect described above is more significantly demonstrated.

[3] Next, the light-emitting layer 4 is formed on the intermediate layer 8.

The light-emitting layer 4 can be formed by the following manner: a particle layer is formed that is mainly composed of the particle 41; the light emitting material 43 is adsorbed to the particle layer; and then, the hole transport material 42 is filled so as to fill the vacancy (gap between the particles 41) in the particle layer with it.

First, the particle layer is formed. The particle layer can be formed, for example, by supplying a dispersion liquid (or colloid solution) containing the particle 41 onto the intermediate layer 8.

As for the method for supplying the dispersion solution, various coating methods such as a spin coating method, a casting method, an extrusion method, a micro gravure coating method, a gravure coating method, a bar coating method (wire bar coating method), a roll coating method, a wire-bar coating method, a dip coating method, a spray coating method, a slide hopper method, a screen printing method, a flexographic printing method, an offset printing method, and an inkjet printing method can be employed. Those coating methods allow a liquid coat to be relatively easily formed.

As for the method for preparing the dispersion solution, for example, in a case where the compound oxide is manufactured by the sol-gel process as described above, the following methods are exemplified. One method is to use the dispersion solution produced in its manufacturing process as it is.

Another method is to disperse the particle 41 into a dispersion medium after manufacturing the particle 41.

In this case, for example, inorganic solvents, various organic solvents, mixed solvents including these solvents, or the like can be used as a solvent for dissolving the organic semiconductor material. Examples of the inorganic solvents include nitric acid, sulfuric acid, ammonia, hydrogen peroxide, water, carbon disulfide, carbon tetrachloride and ethylene carbonate. Also, examples of the various organic solvents include: ketones such as methyl ethyl ketone (MEK), acetone, diethyl ketone, methyl isobutyl ketone (MIBK), methyl isopropyl ketone (MIPK) and cyclohexanon; alcohol solvents such as methanol, ethanol, isopropanol, ethylene glycol, diethylene glycol (DEG) and glycerine; ether solvents such as diethyl ether, diisopropyl ether, 1,2-dimetoxyethane (DME), 1,4-dioxane, tetrahydrofuran (THF), tetrahydropyran (THP), anisole, diethylene glycol dimethyl ether (diglyme) and diethylene glycol ethyl ether (carbitol); cellosolve solvents such as methyl cellosolve, ethyl cellosolve and phenyl cellosolve; aliphatic hydrocarbon solvents such as hexane, pentane, heptane and cyclohexane; aromatic hydrocarbon solvents such as toluene, xylene and benzene; heteroaromatic solvents such as pyridine, pyrazine, furan, pyrrole, thiophene and methylpyrrolidone; amide solvents such as N,N -dimethylformamide (DMF) and N,N-dimethylacetamide (DMA); halogenated compound solvents such as dichloromethane, chloroform and 1, 2-dichloroethane; ester solvents such as ethyl acetate, methyl acetate and ethyl formate; sulfur compound solvents such as dimethyl sulfoxide (DMSO) and sulfolane; nitrile solvents such as acetonitrile, propionitrile and acrylonitrile; and organic acid solvents such as formic acid, acetic acid, trichloroacetic acid and trifluoroacetic acid.

In addition, a dispersion aid such as polymer such as polyethyleneglycol, a surfactant, an acid, and a chelating agent may be added into the dispersion solution, if necessary. Among them, polyethyleneglycol is preferably added. In this case, use of the group of polyethyleneglycols, each having a different average molecular weight enables the viscosity of the dispersion solution to be easily adjusted as well as the particle layer hardly peeled off to be formed.

The viscosity of the dispersion solution depends largely on the kind or dispersibility of the particle 41, the kind of dispersion medium, or an additive such as the surfactant, or a binder.

Because of this, the casting method, the extrusion method or screen printing method is preferably used as the coating method (supplying method) in a case where the dispersion solution has relatively high viscosity (e.g. about 0.01 to 500 P).

In contrast, in a case where the dispersion solution has relatively low viscosity (e.g. 0.01 P or less), the spin coating method, wire bar coating method, or slide hopper method is preferably used as the coating method (supplying method) in order to form a uniform film.

When the dispersion solution is supplied with certain large volume, the extrusion method can supply the dispersion solution even if its viscosity is relatively low.

Moreover, the particle layer is not limited to a single layer structure. It can be structured in multiple layers, for example, by providing multiple layers each containing the particle 41 having a different particle size, or multiple layers each containing the particle 41 having a different type (or a different binder, additive, or the like).

Next, a heating process is carried out, if necessary. This process causes diffusion in the vicinity of the interface between the particles 41, enabling them to be electrically contacted. In addition, the film strength of the particle layer or the adhesiveness between the particle layer and the intermediate (underlayer) 8 can be improved.

In this case, the heating temperature is preferably 40 to 700 degrees centigrade, and more preferably 100 to 600 degrees centigrade. The heating time is preferably about 10 minutes to 10 hours.

The heating process is preferably carried out at as low temperature as possible. The heating temperature can be lowered, for example, by using the particle 41 having an average particle size of 5 nm or less, or by performing the heating process under the presence of a mineral acid (inorganic acid) or the like.

Alternatively, a pressure treatment may be carried out instead of the heating process. In this case, adding the binder such as a polymer into the dispersion solution containing the particle 41 can be omitted.

In addition, for example, a chemical plating process using a solution of titanium tetrachloride in water, an electrochemical plating using a solution of titanium trichloride in water, or the like may be carried out after performing the heating process or pressure treatment.

In the resulting particle layer, a vacancy ratio is preferably as large as possible within the range in which its mechanical strength (film strength) is not significantly lowered. Specifically, the ratio is preferably about 20% to 75%, more preferably about 35% to 60%. This ratio allows the particle layer to be further filled with the hole transport material 42 as well as to be further adsorbed with the light emitting material 43 while preventing the mechanical strength of the particle layer (light-emitting layer 4) from being lowered.

In addition, the particle 41 may be processed with a solution of a metallic compound (processing solvent). The process, for example, is carried out by contacting the solution of the metallic compound to the particle 41 for a given period before adsorbing the light emitting material 43 to the particle 41.

In this regard, the metallic compound may be adsorbed or not adsorbed to the particle 41 after contacting the particle 41. The process also preferably be carried out after forming the particle layer.

As for the metallic compound, alkoxide or halide of at least one metal chosen from the group is exemplified that includes scandium, yttrium, lanthanoid, zirconium, hafnium, niobium, tantalum, gallium, indium, germanium, and tin.

The solution (processing solvent) of the metallic compound is typically prepared as a water solution or alcoholic solution for use.

The exact methods for the process can be exemplified as follows: a method for soaking the particle 41 (particle layer) into the process solvent (soaking method); a method for spraying the process solvent to the particle 41 (particle layer) like a shower for a fixed period (spray method); and the like.

The temperature of the process solvent in the process is not limited to any specific value, but it is preferably about −10 to 70 degrees centigrade, more preferably about 0 to 40 degrees centigrade.

The processing time is, also not particularly limited to, preferably about 1 minute to 24 hours, and more preferably about 30 minutes to 15 hours.

In addition, for example, the particle 41 (particle layer) may be cleaned with cleaning liquid such as distilled water or the like after the process. Moreover, firing or the like may be performed in order to enhance the bonding of substances adsorbed to the particle 41. In this case, the conditions are set in a similar way to the conditions of the heating process as described above.

Then, the light emitting material 43 is bonded (adsorbed) to the particle layer.

This adsorption can be carried out by using the following methods: a method for soaking the substrate 2 on which the particle layer has been formed into a solution (or dispersion solution) of the light emitting material 43; a method for supplying the solution (or dispersion solution) of the light emitting material 43 onto the particle layer by the coating method described as above; or the like.

Examples of the solution (or dispersion medium) used for preparing the solution (or dispersion solution) include: alcohols such as methanol, ethanol, t-butanol, and benzyl alcohol; nitrites such as acetonitrile, propionitrile, and 3-methoxypropionitrile; halogenated hydrocarbons such as nitromethane, dichloromethane, dichloroethane, chloroform, and chlorobenzene; ethers such as diethyl ether, and tetrahydrofuran; amides such as dimethylsulfoxide, N,N-dimethylformamide, and N,N-dimethylacetamido; esters such as N-methylpyrrolidone, 1,3-dimethylimidazolidinone, 3-methyloxazolidinone, ethyl acetate, and butyl acetate; carbonic esters such as diethyl carbonate, ethylenecarbonate, and propylenecarbonate; ketones such as acetone, 2-butanone, and cyclohexanone; and carbon hydrides such as hexane, petroleum ether, benzene, and toluene. These materials can be used singly or a mixture of them.

In addition, a surfactant may be added in the solution (or dispersion solution) so as to be adsorbed with the particle 41 together with the light emitting material 43. This makes it possible to prevent the light emitting materials 43 from being coagulated each other.

Examples of the surfactant include bile acid such as cholic acid, chenodeoxycholic acid, ursodeoxycholic acid, deoxycholicacid, and lithocholic acid, conjugate (taurine conjugate), and the like.

The surplus light emitting material 43 not adsorbed to the particle 41 is preferably removed by a cleaning. As for the cleaning liquid, for example, alcohols, nitrites, or the like described as above can be used.

After adsorbing the light emitting material 43 to the particle 41 (particle layer), the particle 41 (particle layer) may be processed by using the followings: amines such as pyridine, 4-t-butylpyridine, and polyvinyl pyridine; quaternary ammonium salts such as tetrabutylammoniumiodide, and tetrahexylammoniumiodide; ureide compounds having at least one ureide group; silyl compounds having at least one silyl group; alkali metal salts; alkaline earth metal salts, or the like.

Each of the chemical compounds may be used by dissolving it into an organic solvent, or used as it is if it is liquid.

Next, the hole transport material 42 is supplied (filled) so as to fill the gap (vacancy in the particle layer) between the particles 41 with it.

This can be carried out by the similar operation to adsorb the light emitting material 43 to the particle 41 (particle layer).

The light-emitting layer 4 is formed as described above. Alternatively, the light-emitting layer 4 can also be formed by the following manner: a liquid material containing the particle 41, the hole transport material 42, and the light emitting material 43 is prepared; and then the liquid material is supplied onto the intermediate layer 8, being subjected to remove the dispersion medium (being dried, or the like).

[4] Next, the hole transport layer 5 is formed on the light-emitting layer 4.

The hole transport layer 5 also can be formed by the similar operation to adsorb (bond) the light emitting material 43 to the particle 41 (particle layer).

[5] Next, the anode 6 is formed on the hole transport layer 5.

The anode 6 can be formed, for example, by using the vapor deposition, sputtering, joining of metal foil, or the like.

[6] Next, the sealing member 7 is overlaid so as to cover the cathode 3, the light-emitting layer 4, the hole transport layer 5, and the anode 6, being joined to the substrate 2.

After the above-described steps, the light-emitting element 1 of the invention is manufactured.

In the embodiment, a case is described as above in which the inorganic semiconductor material used for the light-emitting layer 4 is the particle. However, the inorganic semiconductor material may be a cluster (block) or the like. The cluster may be compact or porous.

In the embodiment, the gap between the particles 41 is filled with the hole transport material (carrier transport material). However, the hole transport material may be selectively adsorbed to the surface of the particle 41. The resulting structures allow the same effects as described above to be achieved.

Also, in the embodiment, an electron transport layer may be additionally provided between the light-emitting layer 4 and the intermediate layer 8.

In the embodiment, a case is described as above in which the first carrier is electron, and the second carrier is hole. However, the first carrier may be hole, while the second carrier may be electron.

In this case, for example, one in which p-type dopant is arbitrary added into the above-described inorganic semiconductor material is preferably used as the inorganic semiconductor material for the light-emitting layer 4. Also, for example, an electron transport material such as an oxadiazole-based material, a quinolinol complex of metallic ions as typified by AlQ, or a triazine-based material is preferably used as the carrier transport material (electron transport material).

It goes without saying that each of the carrier transport layer and the intermediate layer may be provided if needed, or may be omitted.

In a case where the particle 41 carries the carrier transport material as described above as an example, the carrier transport layer that corresponds to the carrier transport material can be omitted.

The light-emitting element 1, for example, can be used as a light source or the like. In addition, the light-emitting element 1 can structure a display device (light-emitting device of the invention) by arranging it in a matrix.

The driving method for the display device is not limited to any specific method, but an active matrix method or a passive matrix method may be applicable.

Next, an example of a display device to which the light-emitting device of the invention is applied.

Figure 2:
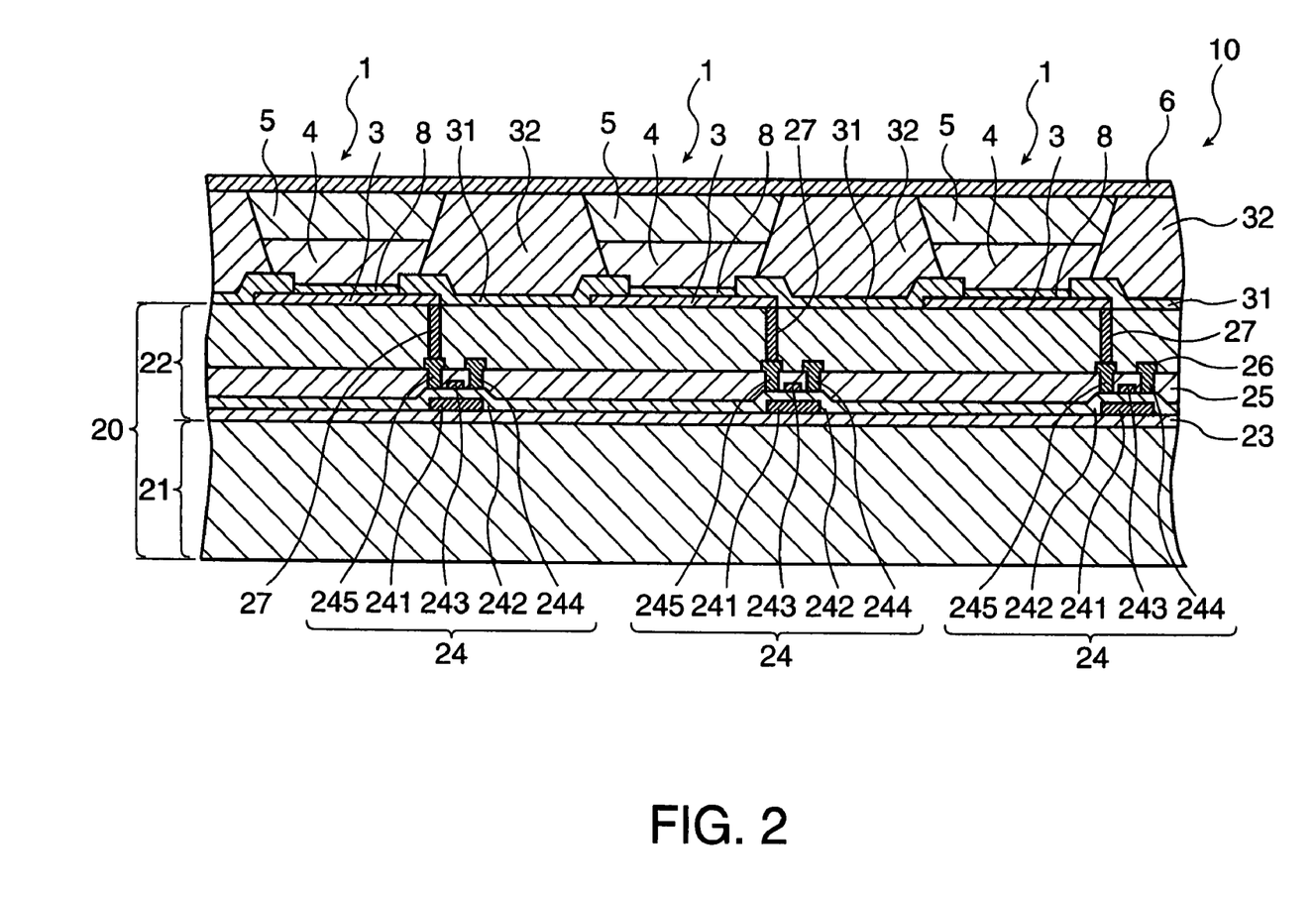
FIG. 2 is a longitudinal sectional view illustrating an embodiment of the display device to which the light-emitting device of the invention is applied.

FIG. 2 is a longitudinal sectional-view illustrating an embodiment of the display device to which the light-emitting device of the invention is applied.

A display device 10 shown in FIG. 2 includes a base 20, and the light-emitting element 1 provided in a plurality of numbers on the base 20.

The base 20 includes a substrate 21 and a circuit part 22 provided on the substrate 21.

The circuit part 22 includes a protective layer 23, which is, for example, composed of a silicon oxide layer, formed on the substrate 21, a TFT (switching element) 24 for driving the light-emitting element formed on the protective layer 23, a first interlayer insulation layer 25, and a second interlayer insulation layer 26.

The TFT 24 includes a semiconductor layer 241 made of silicon, a gate insulation layer 242 formed on the semiconductor layer 241, a gate electrode 243 formed on the gate insulation layer 242, a source electrode 244 and a drain electrode 245.

The light-emitting element 1 is respectively provided on the circuit part 22 corresponding to each TFT 24. The light-emitting elements 1 adjacent each other are partitioned by a first partition part 31 and a second partition part 32.

In the embodiment, the cathode 3 of each light-emitting element 1 constructs a pixel electrode, and is electrically connected to a drain electrode 245 of each TFT 24 with a wiring 27. In addition, the anode 6 of each light-emitting element 1 forms a common electrode.

A sealing member (not shown) is joined to the base 20 so as to cover each light-emitting element 1, thereby sealing each light-emitting element 1.

The display device 10 may appear a monochromatic display, and also can appear a color display by selecting the light emitting material used for each light-emitting element 1.

The display device 10 (light-emitting device of the invention) can be built in various electronic apparatuses.

Figure 3:
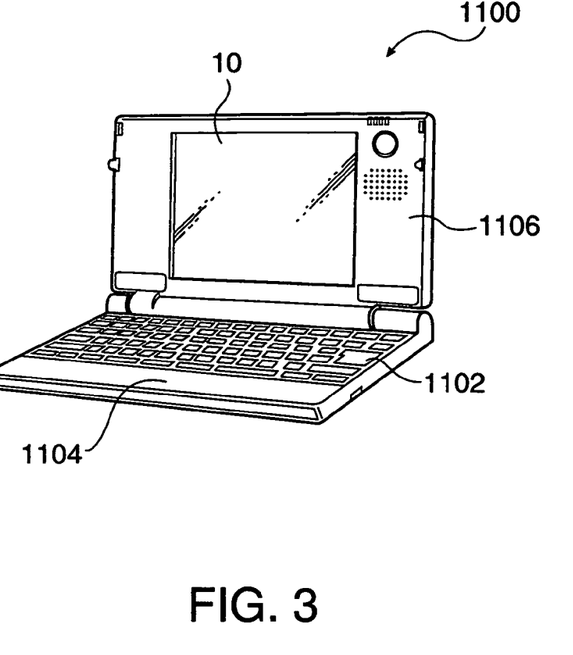
FIG. 3 is a perspective view illustrating the structure of a mobile type (or notebook type) personal computer to which the electronic apparatus of the invention is applied.

FIG. 3 is a perspective view illustrating the structure of a mobile type (or notebook type) personal computer to which the electronic apparatus of the invention is applied.

In the figure, a personal computer 1100 includes a main body portion 1104 equipped with a keyboard 1102 and a display unit 1106, and the display unit 1106 quipped with a display is supported rotatably to the main body portion 1104 via a hinge structure portion.

In the personal computer 1100, the display included in the display unit 1106 is structured by the display device 10.

Figure 4:
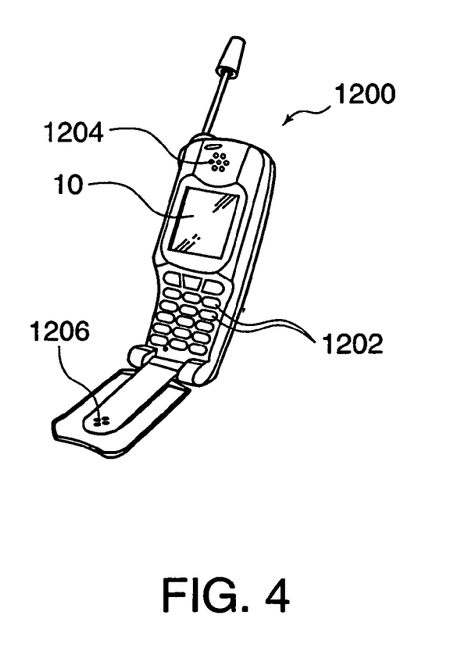
FIG. 4 is a perspective view illustrating the structure of a cellular phone (PHS is also included) to which the electronic apparatus of the invention is applied.

FIG. 4 is a perspective view illustrating the structure of a cellular phone (PHS is also included) to which the electronic apparatus of the invention is applied.

In the figure, a cellular phone 1200 includes a plurality of operating buttons 1202, an earpiece 1204, a mouthpiece 1206, and a display.

In the cellular phone 1200, the display is structured by the display device 10.

Figure 5:
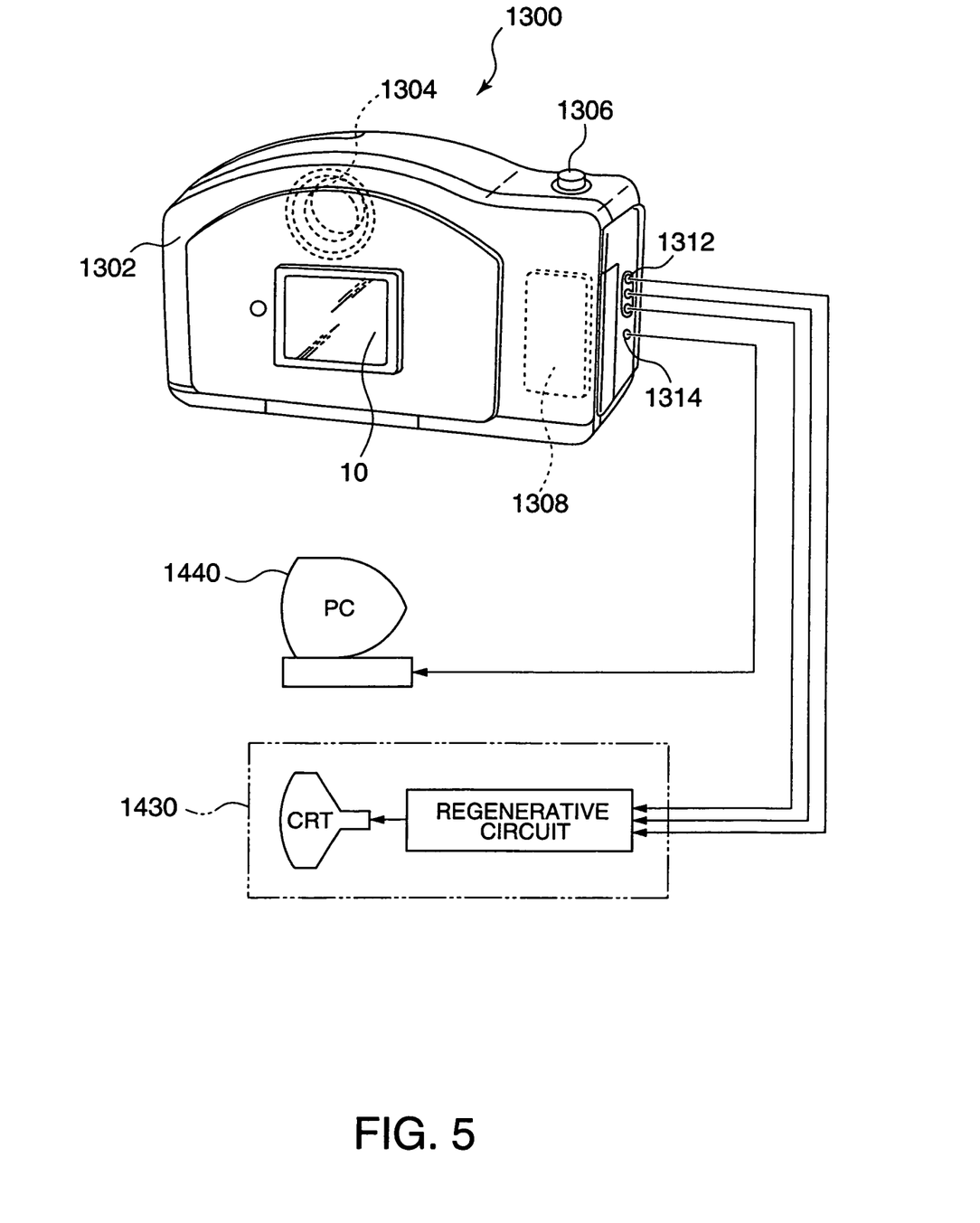
FIG. 5 is a perspective view illustrating the structure of a digital still camera to which the electronic apparatus of the invention is applied.

FIG. 5 is a perspective view illustrating the structure of a digital still camera to which the electronic apparatus of the invention is applied. In addition, in this figure, the coupling to external apparatus is simply illustrated.

Here, in a typical camera, a silver halide photographic film is exposed based on the light image of a photographic subject, while in a digital still camera 1300, the light image of a photographic subject is photo-electric converted with imaging element, such as charge coupled device (CCD), to generate an imaging signal (picture signal).

A display, which is provided on the back face of a case (body) 1302 in the digital still camera 1300, appears a display based on an imaging signal from the CCD, and functions as a finder to display a photographic subject as an electronic image.

In the digital still camera 1300, the display is structured by the display device 10.

A circuit substrate 1308 is set inside the case. The circuit substrate 1308 includes a memory capable to storage (store) the imaging signal.

Moreover, in the front face side (back face side in the structure shown in the figure) of the case 1302, a light-receiving unit 1304 is provided which includes optical lenses (imaging optical system), CCD, and the like.

If a photographer confirms an image of the photographic subject that is displayed on the display, and presses a shutter button 1306, the imaging signal in the CCD at this time is transferred and stored to the memory included in the circuit substrate 1308.

Moreover, in the digital still camera 1300, a video signal output terminal 1312 and an input/output terminal 1314 for data communications are provided at the side face of the case 1302.

In addition, as shown in the figure, a television monitor 1430 is coupled to the video signal output terminal 1312, and a personal computer 1440 is coupled to the input/output terminal 1314 for data communications, respectively, when needed. Furthermore, the imaging signal stored in the memory in the circuit substrate 1308 is output to the television monitor 1430 and to the personal computer 1440 by predetermined operations.

The electronic apparatus of the invention can be applied to, for example, a television, a video camera, a video tape recorder of viewfinder type or monitor viewing type, a laptop type personal computer, a car navigation device, a pager, an electronic notebook (the one with a communication function is also included), an electronic dictionary, a calculator, an electronic game machine, a word processor, a workstation, a videophone, a television monitor for crime prevention, an electronic binoculars, a POS terminal, an apparatus equipped with a touch panel (e.g. a cash dispenser in financial institutions, and an automatic ticket vending machine), a medical apparatus (e.g. an electronic thermometer, a sphygmomanometer, a blood sugar meter, an electrocardiogram display device, an ultrasonic diagnosis equipment, a display for endoscope), a fish detector, various kinds of measurement equipment, meters (i.e. meters of a vehicle, an airplane, and a ship), a flight simulator, various kinds of monitors, a projection type display device such as a projector, and the like, in addition to the personal computer (mobile type personal computer) of FIG. 3, the cellular phone of FIG. 4, and the digital still camera of FIG. 5.

As described above, while the light-emitting element, the light-emitting device and the electronic apparatus of the invention are described based on the illustrated embodiments, but the invention is not limited to these.

EXAMPLES

Specific working examples of the invention will now be described.

1. Manufacturing Light-emitting Element

Example 1

[1] First, a transparent glass substrate having a thickness of 0.5 mm was prepared.

[2] Then, an AlLi electrode (cathode) having an average thickness of 300 nm was formed on the substrate by a vacuum deposition.

Here, the surface resistance of the AlLi electrode was about 5Ω/square.

[3] Then, a titanium oxide ($TiO_2$) layer (intermediate layer) having an average thickness of 3 nm was formed on the AlLi electrode by a vacuum deposition.

[4] Then, a light-emitting layer having an average thickness of 40 nm was formed on the titanium oxide layer.

First, $TiO_2$ particles (average particle diameter: 5 nm) synthesized by the sol-gel process was prepared.

Next, a solution of ethanol in water, which contains the $TiO_2$ (inorganic semiconductor material) particles and polyethyleneglycol, was prepared.

Then, the solution of ethanol in water was coated onto the titanium oxide layer by the spin coating method (2000 rpm), being dried.

Next, the aggregation of $TiO_2$ particles were subjected to a firing under conditions of 450 degrees centigrade and for 30 minutes. As a result, a particle layer was achieved.

Here, the vacancy rate of the particle layer was 55%.

Then, fired substrate was soaked into a solution containing a light emitting material and cholic acid at 40 degrees centigrade and for eight hours. The light emitting material is tri-coordinated iridium complex having a ligand of 2,2'-bipyridine-4,4'-dicarboxylic acid expressed by the chemical formula 2. The resulting substrate was cleaned with ethanol and acetone in order.

Here, the ratio of $TiO_2$ particles to iridium complex was made to be 90:10 by weight.

Next, the substrate having the particle layer to which the light emitting material had been adsorbed was soaked into a water dispersions containing the PEDOT/PSS (hole transport material). Then, the resulting substrate was dried.

Here, the ratio of $TiO_2$ particles to the PEDOT/PSS was made to be 60:40 by weight.

[5] Then, a hole transport layer having an average thickness of 50 nm was formed on the light-emitting layer.

First, xylene solution containing the triphenylamine-based high-molecular weight material presented in the chemical formula 1 was prepared as the material for the hole transport layer.

Then, the xylene solution was coated onto the light-emitting layer by the spin coating method (2000 rpm), being dried.

[6] Then, an ITO electrode (anode) having an average thickness of 100 nm was formed on the hole transport layer by sputtering.

Here, the surface resistance of the ITO electrode, which had been formed on a glass substrate in the same manner as that described above, was about 40Ω/square.

[7] Next, a protective cover (sealing member) made of polycarbonate was overlaid so as to cover each formed layer (light-emitting element). Then, the cover was fixed with an ultraviolet curable resin, sealing the layers.

Example 2

A light-emitting element was manufactured in the same manner as that in the example 1 except for that $V_2O_5$ particles were used instead of $TiO_2$ particles in the light-emitting layer.

Example 3

A light-emitting element was manufactured in the same manner as that in the example 1 except for that $ScVO_4$ particles were used instead of $TiO_2$ particles in the light-emitting layer.

Example 4

A light-emitting element was manufactured in the same manner as that in the example 1 except for that $ScNbO_4$ particles were used instead of $TiO_2$ particles in the light-emitting layer.

Example 5

A light-emitting element was manufactured in the same manner as that in the example 1 except for that $YVO_4$ particles were used instead of $TiO_2$ particles in the light-emitting layer.

Example 6

A light-emitting element was manufactured in the same manner as that in the example 1 except for that $YNbO_4$ particles were used instead of $TiO_2$ particles in the light-emitting layer.

COMPARATIVE EXAMPLE

A light-emitting element was manufactured in the same manner as that in the example 1 except for that a light-emitting layer having an average thickness of 40 nm was formed on the titanium oxide layer by vacuum evaporating the iridium complex in the process [4].

2. Evaluation

The light emitting efficiency of each of the light-emitting elements manufactured in each example and comparative example was evaluated.

The light efficiency evaluation was carried out by measuring luminance with a luminance meter as well as measuring current by applying a voltage of 0 to 6V from a direct-current power supply source.

As a result, it was confirmed that the light emitting efficiency of each light-emitting element of each example (elements of the invention) had increased by about 1.3 times with respect to that of the light-emitting element in the comparative example.

In this regard, the light-emitting elements of the examples 3 to 6 that used the compound oxide particles in the light-emitting layer, particularly the light-emitting element of the example 3, showed a tendency of higher light emitting efficiency.

What is claimed is:

1. A light-emitting element, comprising:
   a first electrode;
   a second electrode;
   a hole transport layer disposed between the first electrode and the second electrode;
   an intermediate layer disposed between the first electrode and the second electrode; and
   a light-emitting layer disposed between the hole transport layer and the intermediate layer, the light-emitting layer including an inorganic semiconductor material, a first material, and a second material, at least one of the first material and the inorganic semiconductor material emitting a light.

2. The light-emitting element according to claim 1, the second material that transports at least one kind of carriers contributing to the light.

3. The light-emitting element according to claim 2, the first material emitting the light, the inorganic semiconductor material transporting a first carrier, and the second material having a function to transport a second carrier.

4. The light-emitting element according to claim 3, the first carrier being an electron, and the second carrier being a hole.

5. The light-emitting element according to claim 4, the inorganic semiconductor material being a metal oxide.

6. The light-emitting element according to claim 5, the metal oxide including a trivalent element and a pentavalent element.

7. The light-emitting element according to claim 4, the second material containing at least one acid group as a linking group bonding to the inorganic semiconductor material.

8. The light-emitting element according to claim 7, the acid group being at least one of —$SO_3H$ group, —COOH group, and —$OP(O)(OH)_2$ group.

9. The light-emitting element according to claim 3, the first material being a metallic complex.

10. The light-emitting element according to claim 1, the light-emitting layer including a plurality of particles each of which includes the inorganic semiconductor material.

11. The light-emitting element according to claim 10, an average particle diameter of the plurality of particles being 0.5 to 10 nm.

12. The light-emitting element according to claim 10, the second material being adsorbed to a surface of each of the plurality of particles, or the second material residing gaps between the plurality of particles.

13. The light-emitting element according to claim 1, the second material including at least one linking group bonding to the inorganic semiconductor material.

14. The light-emitting element according to claim 1, a ratio of the inorganic semiconductor material to the second material being 20:80 to 80:20 by weight.

15. The light-emitting element according to claim 1, a ratio of the inorganic semiconductor material to the first material being 95:5 to 75:25 by weight.

16. The light-emitting element according to claim 1, the light-emitting layer having an average thickness of 1 to 100 nm.

17. The light-emitting element according to claim 1, an intermediate layer including a third material being provided between the light-emitting layer and at least one of the first electrode and the second electrode, and the third material being semiconducting or insulating.

18. The light-emitting element according to claim 17, the intermediate layer having an average thickness of 10 nm or below.

19. A light-emitting device, comprising the light-emitting element according to claim 1.

20. An electronic apparatus, comprising the light-emitting device according to claim 19.

* * * * *